US012805219B2

(12) United States Patent
Soman et al.

(10) Patent No.: US 12,805,219 B2
(45) Date of Patent: Nov. 17, 2026

(54) IN-SITU ETCH AND INHIBITION IN PLASMA ENHANCED ATOMIC LAYER DEPOSITION

(71) Applicant: Applied Materials, Inc., Santa Clara, CA (US)

(72) Inventors: Bhaskar Soman, San Jose, CA (US); Yanze Wu, Sunnyvale, CA (US); Zeqing Shen, San Jose, CA (US); Supriya Ghosh, San Jose, CA (US); Susmit Singha Roy, Campbell, CA (US); Abhijit Basu Mallick, Sunnyvale, CA (US); Siyao Wang, San Jose, CA (US); Keith Tatseun Wong, North Bend, WA (US); Lakmal C. Kalutarage, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 530 days.

(21) Appl. No.: 18/209,711

(22) Filed: Jun. 14, 2023

(65) Prior Publication Data

US 2024/0420934 A1 Dec. 19, 2024

(51) Int. Cl.
*H10P 14/60* (2026.01)
*C23C 16/40* (2006.01)
(Continued)

(52) U.S. Cl.
CPC ........ *H10P 14/6339* (2026.01); *C23C 16/401* (2013.01); *H10P 14/6336* (2026.01);
(Continued)

(58) Field of Classification Search
None
See application file for complete search history.

(56) References Cited

U.S. PATENT DOCUMENTS

2011/0159673 A1 6/2011 Hanawa et al.
2017/0114459 A1* 4/2017 Saly ........................ C23C 16/04
2023/0025645 A1* 1/2023 Ho ....................... H10D 30/024

FOREIGN PATENT DOCUMENTS

CN 115863409 A * 3/2023 .......... H10W 10/011
KR 20120121356 A 11/2012
(Continued)

OTHER PUBLICATIONS

Tw113115185, "Office Action", Apr. 28, 2025, 9 pages.
(Continued)

*Primary Examiner* — Duy N Deo
*Assistant Examiner* — Andrew Keelan Laobak
(74) *Attorney, Agent, or Firm* — Kilpatrick Townsend & Stockton LLP

(57) ABSTRACT

Exemplary methods of semiconductor processing may include methods for nonconformally building up silicon-and-oxygen-containing material where the top of the feature preferentially fills at a slower rate as compared to the bottom of the feature. Such methods may include iterative nonconformal etching operations and/or iterative nonconformal inhibition operations. For example, after building up a layer comprising silicon-and-oxygen-containing material, the layer may be nonconformally etched before building up another layer comprising silicon-and-oxygen-containing material. In another example, in the building up of the layer, an inhibitor may be introduced preferentially at and near the top of the features to provide nonconformal buildup of the silicon-and-oxygen-containing material.

17 Claims, 7 Drawing Sheets

(51) Int. Cl.
*H10P 14/692* (2026.01)
*H10P 50/28* (2026.01)

(52) U.S. Cl.
CPC ...... *H10P 14/69215* (2026.01); *H10P 50/283* (2026.01); *H01J 2237/332* (2013.01)

(56) References Cited

FOREIGN PATENT DOCUMENTS

| | | | | | |
|---|---|---|---|---|---|
| KR | 20150109401 | A | | 10/2015 | |
| TW | 202217951 | A | | 5/2022 | |
| TW | 202319569 | A | | 5/2023 | |
| WO | 2021/202808 | A1 | | 10/2021 | |
| WO | WO-2022027016 | A1 | * | 2/2022 | .......... H10P 14/6334 |
| WO | 2023/283144 | A1 | | 1/2023 | |

OTHER PUBLICATIONS

International Search Report and Written Opinion for PCT/US2024/025652 mailed Aug. 7, 2024, 11 pages.

International Application No. PCT/US2024/025652, International Preliminary Report on Patentability mailed on Dec. 26, 2025, 8 pages.

Taiwanese Application No. 113115185, Notice of Decision to Grant mailed on Oct. 27, 2025, 4 pages (2 pages of original document and 2 pages of English Translation).

* cited by examiner

IN-SITU ETCH AND INHIBITION IN PLASMA ENHANCED ATOMIC LAYER DEPOSITION

TECHNICAL FIELD

The present technology relates to methods and components for semiconductor processing. More specifically, the present technology relates to systems and methods for depositing silicon-containing materials with reduced void or seam formation.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing may result in voids or seams in the materials that may result in unwanted or undesirable effects in further processing. Developing materials that can control voids or seams formation may become more difficult as device sizes continue to scale.

Thus, there is a need for improved systems and methods that can be used to produce high quality devices and structures. These and other needs are addressed by the present technology.

SUMMARY

Exemplary methods of semiconductor processing may include methods for nonconformally building up silicon-and-oxygen-containing material to fill features on a substrate. Said methods may include iteratively repeating a deposition cycle on a substrate disposed within a processing region of a semiconductor processing chamber to deposit about 100 Å to about 1000 Å of a silicon-and-oxygen-containing material on one or more features. The substrate may define the one or more features along the substrate, where each of the features has a top, a bottom, and sidewalls connecting the top and the bottom. The silicon-containing precursor may deposit within the one or more features. The deposition cycle may include depositing a silicon-containing material on the substrate then purging the processing region. The deposition cycle may further include exposing the silicon-containing material to an oxygen plasma to convert the silicon-containing material to a silicon-and-oxygen-containing material then purging the processing region. After iteratively repeating the deposition cycle, the method may include exposing the silicon-and-oxygen-containing material to an etching agent to nonconformally remove a portion of the silicon-and-oxygen-containing material. The nonconformal removal may occur to a greater degree at the top of the features as compared to the bottom of the features. The deposition cycle followed by the exposure to the etching agent may be repeated iteratively to fill the one or more features with the silicon-and-oxygen-containing material. In some embodiments, the nonconformal removal removes about 10 Å to about 100 Å of the silicon-and-oxygen-containing material from the top of the features.

In some embodiments, the sidewalls of the one or more features may be tapered sidewalls. In some embodiments, after each of the exposures to the etching agent, an angle of a sidewall of the silicon-and-oxygen-containing material may increase as compared to a previous exposure to the etching agent. Said angle increases may be about 5° or greater. The etching agent may include products of a plasma produced using a halogen-containing precursor. The halogen-containing precursor may include one or more of: nitrogen trifluoride ($NF_3$), hydrogen bromide (HBr), fluoromethane ($CH_3F$), difluoromethane ($CH_2F_2$), trifluoromethane ($CHF_3$), carbon tetrafluoride ($CF_4$), and boron trichloride ($BCl_3$). A distance between the substrate and where the etching agent enters the processing region may be about 4 mm to about 50 mm. The plasma may be at a plasma power of about 500 W or less. An exposure time to the plasma may be about 60 seconds or less.

Some embodiments on the present technology may encompass semiconductor processing methods. The methods may include providing a nitrogen-containing inhibitor to a processing region of a semiconductor processing chamber. A substrate may be disposed within the processing region of the semiconductor processing chamber. The substrate may define one or more features along the substrate where each of the one or more features has a top, a bottom, and sidewalls connecting the top and the bottom. The method may further include absorbing the nitrogen-containing inhibitor on the top of the one or more features to a greater extent than on the bottom of the one or more features. The method may further include depositing a silicon-containing material on the substrate. The method may further include exposing the silicon-containing material to an oxygen plasma to convert the silicon-containing material to a silicon-and-oxygen-containing material. The foregoing steps may be repeated iteratively to fill the one or more features with the silicon-and-oxygen-containing material.

In some embodiments, the nitrogen-containing inhibitor is a product of a plasma of a nitrogen-containing precursor. The nitrogen-containing precursor may include ammonia, nitrogen, or a combination thereof. A gas used to produce the plasma may include 5 mol % to 75 mol % of the nitrogen-containing precursor. A distance between the substrate and where the nitrogen-containing inhibitor enters the processing region may be about 4 mm to about 50 mm. The plasma may be at a plasma power of about 500 W or less. An exposure time to the plasma may be about 60 seconds or less.

Some embodiments on the present technology may encompass semiconductor processing methods. The methods may include providing a nitrogen-containing inhibitor to a processing region of a semiconductor processing chamber. A substrate may be disposed within the processing region of the semiconductor processing chamber. The substrate may define one or more features along the substrate where each of the one or more features has a top, a bottom, and sidewalls connecting the top and the bottom. The method may further include absorbing the nitrogen-containing inhibitor on the top of the one or more features to a greater extent than on the bottom of the one or more features. The method may further include depositing a silicon-containing material on the substrate after said absorbing. The method may further include exposing the silicon-containing material to an oxygen plasma to convert the silicon-containing material to a silicon-and-oxygen-containing material. The method may further include iteratively repeating the foregoing steps to deposit about 50 Å to about 500 Å of the silicon-and-oxygen-containing material on the one or more features on the substrate. Then, after said repetitions to deposit the silicon-and-oxygen-containing material, the method may include exposing the silicon-and-oxygen-containing material to an etching agent to remove about 10 Å to about 100 Å of the silicon-and-oxygen-containing material. The cycle of depositing the silicon-and-oxygen-containing material followed by the removal of the silicon-and-oxygen-containing material using the etching agent may be repeated iteratively to fill the one or more features with the silicon-and-oxygen-containing material.

In some embodiments, the etching agent may comprise products of a plasma produced using a halogen-containing precursor. The nitrogen-containing inhibitor may be a product of a plasma of a nitrogen-containing precursor.

Such technology may provide numerous benefits over conventional systems and techniques. For example, embodiments of the present technology may reduce the void or seam size applicable to a number of substrate features. Additionally, the present technology may produce silicon-containing films for gap filling applications, as well as any other application for which deposited films, characterized by a reduced void or seam size, may be a benefit. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
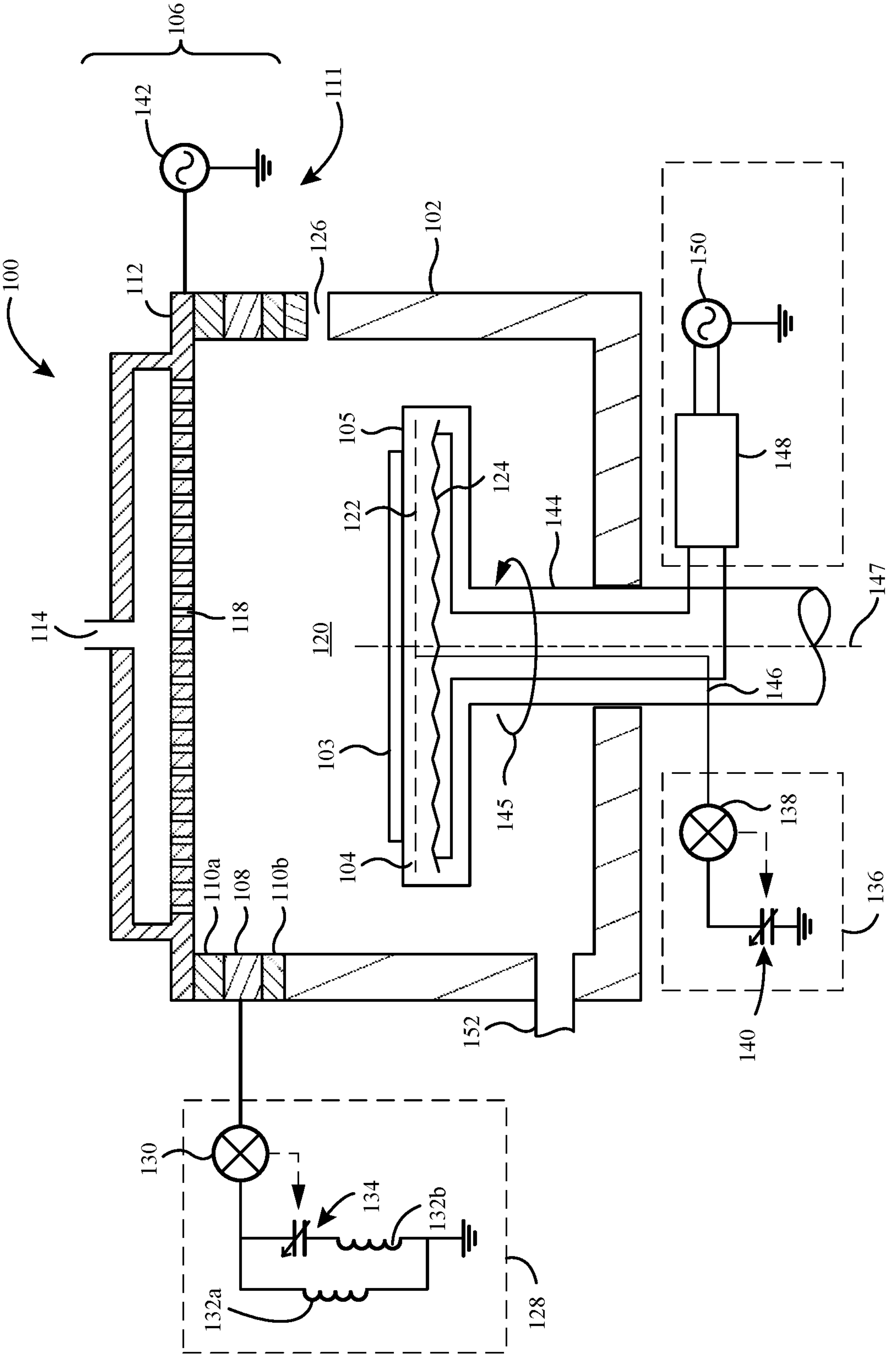
FIG. 1 shows a schematic cross-sectional view of an exemplary plasma system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Features across semiconductor structures may be reduced in size, and aspect ratios of the features may increase. As the aspect ratios of the features increase, chemical vapor deposition processes may produce voids or seams within the feature due to pinch-off nearer the top of the feature prior to complete fill within the feature.

Conventional technologies, such as operations associated with gate all around (GAA) and 3D NAND, have struggled to produce films to fill high aspect ratio features in the underlying structures where void or seam formation is controlled. Deposition of silicon-containing materials on the underlying structures containing the high aspect ratio trenches may be incomplete because many silicon-containing film depositions produce conformal films. The fill operation may result in the feature sealing near the top of the feature prior to fill within the feature, which may produce a void in the fill material or a seam up the middle of the feature, which can extend to the top of the structure. In some production, where a polishing operation may subsequently occur, the removal may cause the void or seam to be exposed, which may provide access within the feature. This may allow oxidation of the material once exposed to atmosphere, as well as incorporation of slurry or other materials along the void or seam. Accordingly, many conventional technologies have been limited in the ability to prevent structural flaws in the final devices.

The present technology overcomes these issues by incorporating in-situ etch and/or inhibition operations in plasma enhanced atomic layer deposition methods. These additional operations allow for a nonconformal deposition of the silicon-and-oxygen containing material where the top of the feature preferentially fills at a slower rate as compared to the bottom of the feature, which mitigates pinch-off nearer the top of the feature prior to complete fill within the feature.

By filling the features or high aspect ratio structure with silicon-and-oxygen-containing material with a reduced or eliminated void or seam, the present technology may prevent problems in any following integration processes and/or defects in the final devices. Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary semiconductor processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The semiconductor processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support 104 during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the semiconductor processing chamber 100 to control plasma distribution across the substrate 103 disposed on the substrate support 104. The plasma profile modulator 111 may include a first electrode 108 that may be disposed adjacent to the chamber body 102 and may separate the chamber body 102 from other components of the lid assembly 106. The first electrode 108 may be part of the lid assembly 106 or may be a separate sidewall electrode. The first electrode 108 may be an annular or ring-like member and may be a ring electrode. The first electrode 108 may be a continuous loop around a circumference of the semiconductor processing chamber 100 surrounding the processing volume 120 or may be discontinuous at selected locations if desired. The first electrode 108 may also be a perforated electrode, such as a perforated ring or a mesh electrode, or may be a plate electrode, such as, for example, a secondary gas distributor.

One or more isolators 110*a*, 110*b*, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the semiconductor processing chamber 100. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the semiconductor processing chamber 100. The first tuning circuit 128 may include a first electronic sensor 130 and a first electronic controller 134. The first electronic controller 134 may be or may include a variable capacitor or other circuit elements. The first tuning circuit 128 may be or may include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between the ground and the first electronic sensor 130. The first circuit leg may include a first inductor 132*a*. The second circuit leg may include a second inductor 132*b* coupled in series with the first electronic controller 134. The second inductor 132*b* may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with the surface 105 of the substrate support 104. The second electrode 122 may be a plate, a perforated plate, a mesh, a wire screen, or any other distributed arrangement of conductive elements. The second electrode 122 may be a tuning electrode and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the semiconductor processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the semiconductor processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support 104. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support 104 may decline. The second electronic controller 140 may have a similar effect, increasing and decreasing aerial coverage of the plasma over the substrate support 104 as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
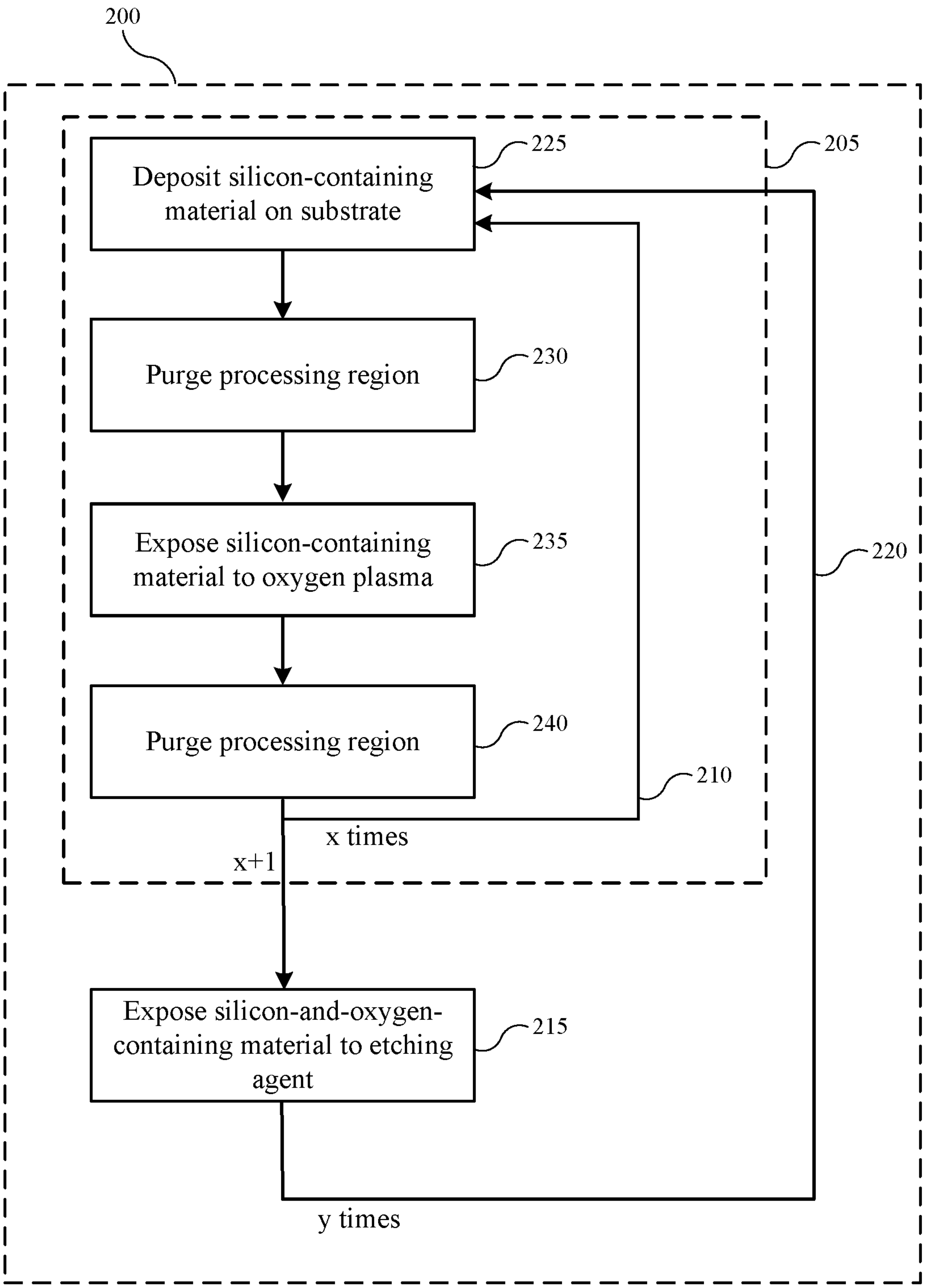
FIG. 2 shows operations in a semiconductor processing method according to some embodiments of the present technology.

FIG. 2 shows exemplary operations in a processing method 200 according to some embodiments of the present technology. The method 200 may be performed in a variety of processing chambers, including the semiconductor processing chamber 100 described above. Method 200 may include one or more operations prior to the initiation of the method 200, including front-end processing, deposition, etching, polishing, cleaning, or any other operations that may be performed prior to the described operations. The methods 200 may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 200 may describe operations shown schematically in FIGS. 3A-3H, the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3A:
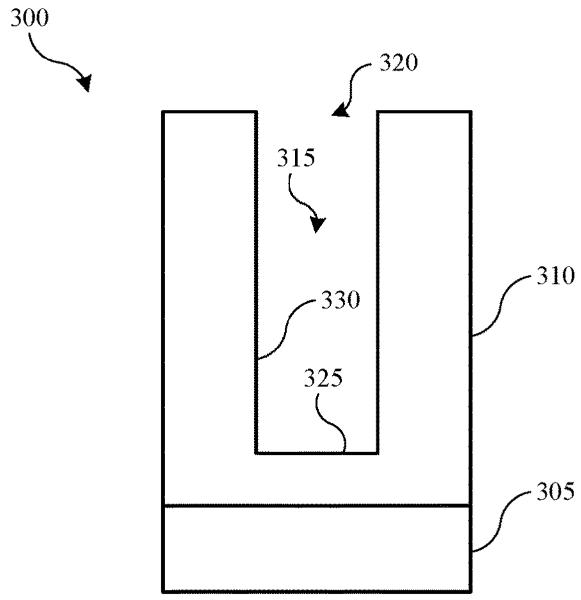
FIGS. 3A-3H show exemplary schematic cross-sectional structures in which material layers are included and produced according to some embodiments of the present technology.

Method 200 may or may not involve optional operations to develop the semiconductor structure to a particular fabrication operation. It is to be understood that method 200 may be performed on any number of semiconductor structures or substrates 305, as illustrated in FIG. 3A, including exemplary structure 300 on which one or more silicon-containing materials may be formed. As illustrated in FIG. 3A substrate 305 may be processed to form one or more features 315, which may be recessed, such as trenches, apertures, or any other structure in semiconductor processing. Substrate 305 may be any number of materials, such as a base wafer or substrate 305 made of silicon or silicon-containing materials, other substrate 305 materials, as well as one or more materials that may be formed overlying the substrate 305 during semiconductor processing. For example, in some embodiments the substrate 305 may be processed to include one or more materials or structures for semiconductor processing. Substrate 305 may be or may include a dielectric material, such as an oxide or nitride of any number of materials. In embodiments, one or more layers of material 310 may be deposited on the substrate 305. In embodiments, the one or more layers of material 310 may be or may include a silicon-containing material. The silicon-containing material may be or may include silicon, including amorphous silicon, doped silicon, silicon oxide, silicon nitride, or silicon carbide.

As shown, one or more features 315 may be defined by the one or more layers of material 310 and/or substrate 305, such as a trench, aperture, or other recessed feature. The features 315 may include a top 320, a bottom 325, and sidewalls 330 connecting the top 320 and bottom 325.

While the illustrated features 315 are characterized by vertical sidewalls, the features 315 may alternatively be characterized by tapered sidewalls. In tapered sidewall embodiments, the features may be characterized by a larger diameter or width at the top of the features than at the bottom of the features. The aspect ratio of the features, or the ratio of the depth of the feature relative to the width or diameter of the feature formed, may be greater than or about 1:1, and may be greater than or about 2:1, than or about 3:1, greater than or about 4:1, greater than or about 5:1, greater than or about 6:1, greater than or about 7:1, greater than or about 8:1, greater than or about 9:1, greater than or about 10:1, or more.

Although only one feature 315 is shown in the figures, it is to be understood that exemplary structures may have any number of features 315 defined along the structure according to embodiments of the present technology.

Figure 3B:
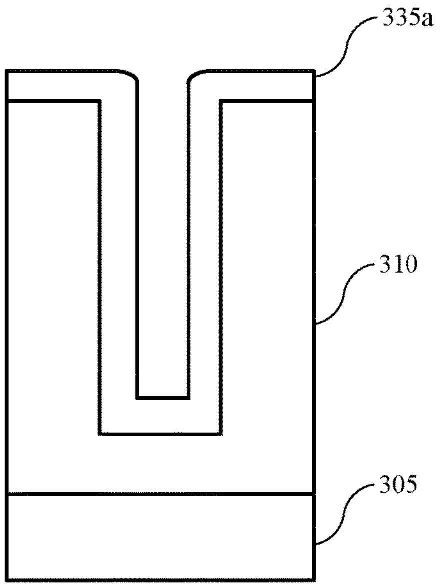

The method 200 includes a deposition cycle 205 that includes a series of operations that are iteratively repeated 210 x number of times to build up a layer 335*a* comprising silicon-and-oxygen-containing material, illustrated in FIG. 3B. In embodiments, x may be about 3 or more, about 5 or more, about 10 or more, about 20 or more, about 30 or more, about 40 or more, about 50 or more, about 250 or less, about 225 or less, about 200 or less, about 175 or less, about 150 or less, about 3 to about 250, about 10 to about 250, about 50 to about 250, about 3 to about 200, about 3 to about 150, about 10 to about 200, about 10 to about 150, or about 50 to about 200 or more.

Figure 3C:
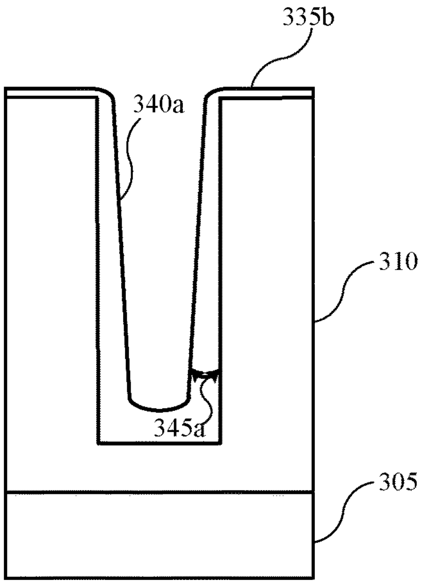

After x number of times repeating the series of operations in the deposition cycle 205, the method 200 includes an operation 215 that exposes the layer 335*a* comprising silicon-and-oxygen-containing material to an etching agent that removes at least some of the silicon-and-oxygen-containing material from layer 335*a*. The etching in the operation 215 may selectively remove the silicon-and-oxygen-containing material from the layer 335*a* to a greater degree at the top 320 and/or sidewalls 330 of the features 315 as compared to the bottom 325 of the features 315. Accordingly, as illustrated in FIG. 3C, the resultant etched layer 335*b* comprising the silicon-and-oxygen-containing material may have tapered sidewalls 340*a* within the features 315.

Figure 3D:
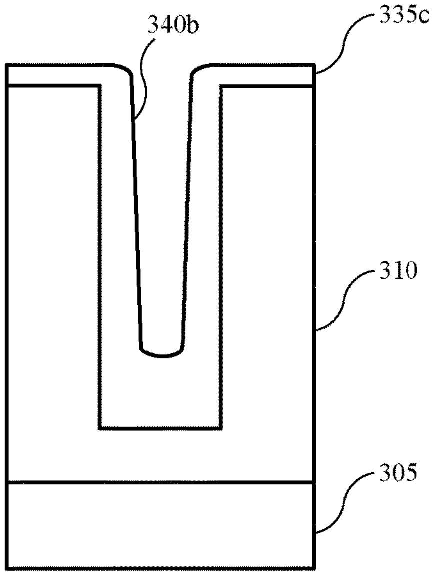
Figure 3E:
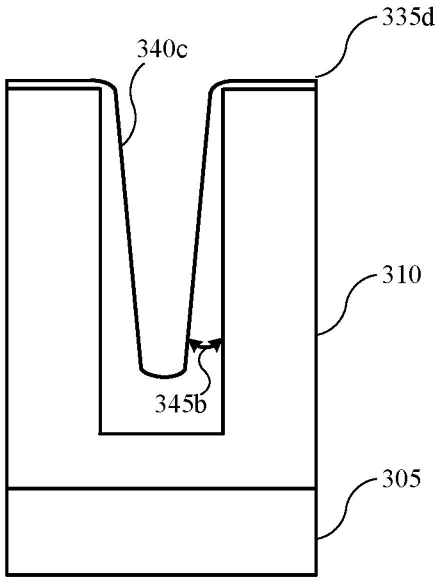
Figure 3F:
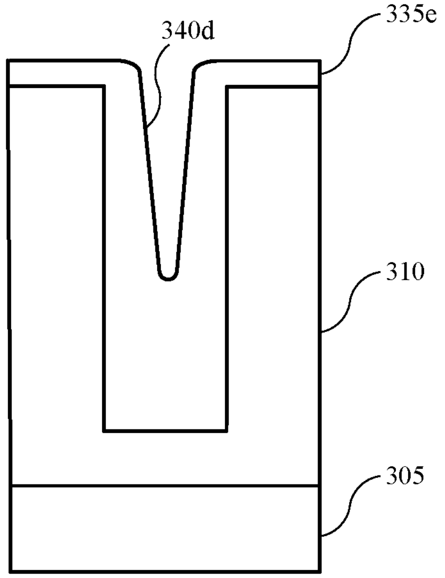
Figure 3G:
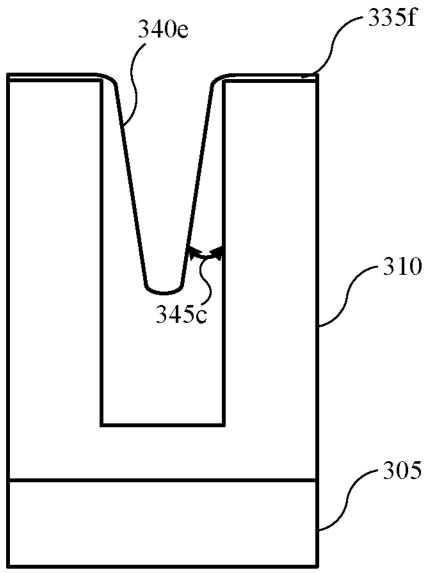
Figure 3H:
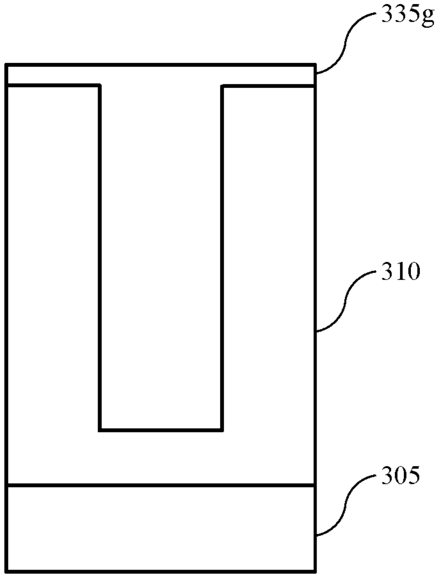

After the operation 215, the deposition cycle 205 is repeated 220 to increase the thickness of the silicon-and-oxygen-containing material and produce layer 335*c* having tapered sidewalls 340*b* with in the features 315, as illustrated in FIG. 3D. Another operation 215 is then performed to preferentially etch the layer 335*c* at the top 320 and/or sidewalls 330 of the features 315 as compared to the bottom 325 of the features 315. The resultant etched layer 335*d* comprising the silicon-and-oxygen-containing material to produce layer 335*d* having tapered sidewalls 340*c*. The deposition cycle 205 followed by the operation 215 is repeated again to produce (a) a layer 335*e* comprising the silicon-and-oxygen-containing material having tapered sidewalls 340*d* after the deposition cycle 205 and (b) an etched layer 335*f* comprising the silicon-and-oxygen-containing material having tapered sidewalls 340*e* after the operation 215. Performing the deposition cycle 205 followed by the operation 215 is iteratively repeated 220 y number of times to fill the one or more features 315 with the silicon-and-oxygen-containing material 335*g*, as illustrated in FIG. 3H. In embodiments, y may be about 2 or more, about 3 or more, about 4 or more, about 5 or more, about 10 or more, about 15 or more, about 50 or less, about 40 or less, about 30 or less, about 20 or less, about 10 or less, about 2 to about 50, about 2 to about 30, about 3 to about 50, about 3 to about 30, about 3 to about 10, about 5 to about 25, about 10 to about 40, or about 15 to about 50 or more.

The illustrated deposition cycle 205 includes four operations. The first operation 225 deposits silicon-containing material on the substrate. This may be achieved by providing a silicon-containing precursor to the processing region of the semiconductor processing chamber. The silicon-containing precursor may be provided to the same processing region of the semiconductor processing chamber to perform operations prior to the initiation of the method 200. Silicon-containing precursors that may be used in method 200 may be or may include any number of silicon-containing precursors. For example, the silicon-containing precursor may be or may include silane ($SiH_4$), dislane ($Si_2H_6$), silicon tetrachloride ($SiCl_4$), tetraethyl orthosilicate (TEOS), di-isopropyl aminosilane (DIPAS), bis(diethylamino) silane (BDEAS), bis(t-butylamino) silane (BTBAS), or any other precursor able to form, for example, a silicon oxide (SiO), a silicon nitride (SiN), or a silicon carbide (SiC) material. In some embodiments, along with the silicon-containing precursor, one or more additional precursors may be delivered, such as a hydrogen-containing precursor as well as one or more carrier or inert gases, such as argon or helium, for example.

The silicon-containing precursor deposits on the substrate as a silicon-containing material. It should be noted that "depositing on the substrate" encompasses depositing on features, layers (e.g., a layer of silicon-and-oxygen containing material or a densified layer of silicon-and-oxygen containing material), or the like that are already present on the substrate. That is, the silicon-containing material may extend along any and/or all exposed surfaces along the substrate, when exposed, as well as any other incorporated materials, such as any previously formed silicon-and-oxygen containing material or densified silicon-and-oxygen containing material. During operation 225, deposition of the silicon-containing material may occur inward within features, if present, for example, from the sidewalls defining the feature.

Depositing the silicon-containing material on the substrate at operation 225 may be performed as a plasma-free operation. By performing operation 225 plasma-free, the deposition of the silicon-containing material may be highly conformal. In embodiments, the deposition of the silicon-containing material may be characterized by a conformality of greater than or about 80%, greater than or about 85%, greater than or about 90%, greater than or about 95%, greater than or about 97%, greater than or about 99%, or about 100%.

Operation 225 may be performed for about 5 seconds or less, about 4 seconds or less, about 3 second or less, about 2 seconds or less, about 1 second or less, about 0.5 seconds or less, about 0.1 seconds to about 5 seconds, about 0.1 seconds to about 0.5 seconds, about 0.25 seconds to about 1 second, about 0.25 seconds to about 1.5 seconds, about 1 second to about 3 seconds, or about 2 seconds to about 5 seconds.

After operation 225, operation 230 may be performed where the processing region is purged to remove excess silicon-containing precursor. Purging may be achieved by reducing the pressure in the semiconductor processing chamber or flowing a gas (e.g., an inert gas like argon or nitrogen) through the semiconductor processing chamber.

Operation 230 may be performed for about 5 seconds or less, about 4 seconds or less, about 3 second or less, about 2 seconds or less, about 1 second or less, about 0.5 seconds or less, about 0.1 seconds to about 5 seconds, about 0.1 seconds to about 0.5 seconds, about 0.25 seconds to about 1 second, about 0.25 seconds to about 1.5 seconds, about 1 second to about 3 seconds, or about 2 seconds to about 5 seconds.

After operation 230, the method 200 may include operation 235 that exposes the silicon-containing material to an oxygen plasma to convert the silicon-containing material to a silicon-and-oxygen-containing material. The plasma may be formed from an oxygen-containing precursor. Oxygen-containing precursors that may be used in method 200 may be or may include any number of oxygen-containing precursors. For example, the oxygen-containing precursor may be or may include nitrous oxide ($N_2O$), water ($H_2O$), diatomic oxygen ($O_2$), ozone ($O_3$), a combination of one or more of these, or any other oxygen-containing materials. Inert gas like argon may also be present.

The plasma power in operation 235 may be about 2500 Watts (W) or less, about 2000 W or less, about 1750 W or less, about 1500 W or less, about 1250 W or less, about 1000 W or less, about 1 W to about 2500 W, about 1 W to about 500 W, about 100 W to about 2500 W, about 100 W to about 1000 W, about 500 W to about 2500 W, or about 1000 W to about 2500 W.

The exposure time (or length of time of operation 235 is performed) may be about 5 seconds or less, about 4 seconds or less, about 3 second or less, about 2 seconds or less, about 1 second or less, about 0.5 seconds or less, about 0.1 seconds to about 5 seconds, about 0.1 seconds to about 0.5 seconds, about 0.25 seconds to about 1 second, about 0.25 seconds to about 1.5 seconds, about 1 second to about 3 seconds, or about 2 seconds to about 5 seconds.

In some embodiments, the oxygen-containing precursor may include a one or both of $N_2O$ and $O_2$.

After operation 235, operation 240 may be performed where the processing region is purged to remove remnants from the oxygen plasma and byproducts from the conversion of the silicon-containing material to the silicon-and-oxygen-containing material. Purging may be achieved by reducing the pressure in the semiconductor processing chamber or flowing a gas (e.g., an inert gas like argon or nitrogen) through the semiconductor processing chamber.

Operation 240 may be performed for about 5 seconds or less, about 4 seconds or less, about 3 second or less, about 2 seconds or less, about 1 second or less, about 0.5 seconds or less, about 0.1 seconds to about 5 seconds, about 0.1 seconds to about 0.5 seconds, about 0.25 seconds to about 1 second, about 0.25 seconds to about 1.5 seconds, about 1 second to about 3 seconds, or about 2 seconds to about 5 seconds.

While the illustrated deposition cycle 205 illustrates four operations 225, 230, 235, 240, the deposition cycle may include other operations or not include one or more of the illustrated operations 225, 230, 235, 240.

Each deposition cycle 205 (e.g., the four operations 225, 230, 235, 240 iteratively repeated 210) may be characterized by an amount of the silicon-and-oxygen-containing material deposited, which may be about 50 Å or more, about 75 Å or more, about 100 Å or more, about 150 Å or more, about 200 Å or more, about 50 Å to about 100 Å, about 50 Å to about 200 Å, about 100 Å to about 500 Å, or about 250 Å to about 500 Å. The amount of the silicon-and-oxygen-containing material deposited may be measured at the top of the feature.

After the deposition cycle 205, the method includes the operation 215 to selectively etch the deposited layer comprising the silicon-and-oxygen-containing material. Etching may be achieved by exposing the silicon-and-oxygen-containing material to an etching agent. The etching agent may comprise products of a plasma produced using a halogen-containing precursor. Examples of halogen-containing precursors may include, but are not limited to, nitrogen trifluoride ($NF_3$), hydrogen bromide (HBr), hydrofluorocarbons ($CH_xF_y$), fluoromethane ($CH_3F$), difluoromethane ($CH_2F_2$), trifluoromethane ($CHF_3$), carbon tetrafluoride ($CF_4$), boron trichloride ($BCl_3$), the like, and any combination thereof.

The halogen-containing precursor may be present at about 5 mol % or greater, about 10 mol % or greater, about 25 mol % or greater, about 50 mol % or greater, about 75 mol % or greater, about 5 mol % to about 90 mol %, about 5 mol % to about 75 mol %, about 5 mol % to about 50 mol %, or about 10 mol % to about 75 mol %, based on a total number of mols of gas used to produce the plasma. The balance of the gas may be inert gases like $N_2$ and/or Ar. Without being limited by theory, it is believed that lower concentrations of halogen-containing precursor increases preferential etching at and near the top 520 of the features 515 because less of the species that cause etching are produced. Therefore, the etching agent is used before reaching the bottom 525 of the features 515.

Selective etching (or etching of the silicon-and-oxygen-containing material near the top or sidewalls of the feature as compared to the bottom of the feature) may be achieved by controlling the spacing between the substrate and the etching agent entrance to the processing region (where a lower distances may increase etching at the bottom of the features), controlling the plasma power (where a higher plasma power may increase etching at the bottom of the features), controlling the duration of the etching, controlling a pressure in the processing region, controlling a concentration of the etching agent in the processing region, selecting plasma sources and/or conditions (e.g., radiofrequency (RF) plasma or remote plasma source (RPS), pulsing, etc.), and any combination thereof.

The distance between the substrate and the etching agent entrance to the processing region may be controlled by adjusting the distance between the substrate support 104 and the gas distributor 112 of the semiconductor processing chamber 100. One skilled in the art will recognize the application and adjustment of this distance to other semiconductor processing chambers having different configurations.

Without being limited by theory, it is believed that closer distances increase the conformality of the etching. However, distances too far apart may not provide sufficient etching even at the top of the layer comprising the silicon-and-oxygen-containing material. The distance between the substrate and the etching agent (or plasma thereof) entrance to the processing region may be about 150 mil or greater, about 200 mil or greater, about 250 mil or greater, about 300 mil or greater, about 150 mil to about 2000 mil, about 150 mil to about 1500 mil, about 300 mil to about 1500 mil, about 300 mm to about 1200 mm, or about 500 mil to about 2000 mil.

Without being limited by theory, when plasma produced from an etching agent is used, higher plasma powers may increase the conformality of the etching. If the etching agent is used in producing a plasma, the plasma power in operation 215 may be about 500 W or less, about 400 W or less, about 300 W or less, about 200 W or less, about 100 W or less, about 1 W to about 500 W, about 1 W to about 250 W, about 1 W to about 100 W, about 50 W to about 250 W, about 50 W to about 300 W, about 100 W to about 300 W, or about 250 W to about 500 W.

The plasma source may be a capacitively-coupled plasma ("CCP") formed within a remote region or a remote plasma unit ("RPS unit") that is separate from the processing chamber. The CPC plasma source may be preferred in some embodiments.

Further, the RF power source (e.g., source of electric power 142) may produce power at a frequency of greater than or about 100 kHz, greater than or about 500 kHz, greater than or about 1 MHz, greater than or about 10 MHz, greater than or about 20 MHz, greater than or about 50 MHz, greater than or about 100 MHz, among other frequency ranges. Specific examples of frequencies of the power produced by RF power source include 350 kHz, 2 MHz, 13.56 MHz, 27 MHz, 40 MHz, 60 MHz, 100 MHZ, and 162 MHZ, among other frequencies. The plasma may be a dual or single frequency plasma. A dual frequency plasma may include a low frequency (e.g., 500 kHz or less, or 350 kHz) and a high frequency (e.g., greater than or about 10 MHz, or 27 MHz).

Without being limited by theory, when plasma produced from an etching agent is used, higher exposure times may increase the conformality of the etching. The exposure time (or length of time of operation 215 is performed) to the etching agent or plasma produced therefrom may be about 60 seconds or less, about 45 seconds or less, about 30 second or less, about 15 seconds or less, about 5 seconds or less, about 1 second or less, about 0.1 seconds to about 60 seconds, about 1 second to about 30 seconds, about 5 seconds to about 30 second, about 10 seconds to about 60 seconds, or about 30 seconds to about 60 seconds.

As selective etching is desired, the distance between the substrate and the etching agent (or plasma thereof) entrance, the plasma power, and the exposure time may be selected to provide selective etching of the silicon-and-oxygen-containing material near the top of the features as compared to the bottom of the features. Selective etching produces tapering in the sidewalls of the layer comprising the silicon-and-oxygen-containing material.

After each of the operations 215, the degree of tapering of the sidewalls of the layer comprising the silicon-and-oxygen-containing material may increase. As described above, voids or seams in the silicon-and-oxygen-containing material located within the feature may be formed by pinch-off nearer the top of the feature prior to complete fill within the feature with the silicon-and-oxygen-containing material. Advantageously, the method 200 illustrated in FIG. 2 and FIGS. 3A-3H increase the degree of tapering of the sidewalls of the layer comprising the silicon-and-oxygen-containing material and preferentially fill the features 315 from the bottom 325 of the feature towards the top 320 of the features 315. As such, opening the top 320 of the features 315 may be sufficiently large for each deposition cycle 205 to mitigate formation of a void or seam.

The degree of tapering may be characterized by the angle 340 of the tapered sidewall of the layer relative to vertical. In FIGS. 3C, 3E, and 3G the angle is labeled as angles 345*a*, 345*b*, and 345*c*, respectively. Because the sidewall 330 of the features 315 is illustrated as vertical, the angles 345*a*, 345*b*, and 345*c* are illustrated as being measured from the feature sidewall 330 to the tapered sidewalls 340*a*, 340*c*, and 340*e* of the layers 335*b*, 335*d*, and 335*f*, respectively. One skilled in the art will recognize that the angle would be measured from a vertical line from the top 320 of the features 315 if the features 315 were tapered rather than from the sidewall of the feature.

After an etching operation (e.g., operation 215), the degree of tapering of the sidewall of a layer comprising the silicon-and-oxygen-containing material may be characterized by an angle from vertical of about 5° or greater, about 20° or greater, about 40° or greater, about 5° to about 90°, about 5° to about 30°, about 20° to about 60°, about 40° to about 75°, or about 60° to about 90°. The increase in the degree of tapering of the sidewall of said layer between two consecutive etching operations (e.g., from FIG. 3C to FIG. 3E or from FIG. 3E to FIG. 3G) may be characterized by an increase in the angle of about 1° or greater, about 5° or greater, about 10° or greater, about 10° to about 30°, about 5° to about 20°, or about 10° to about 30°.

Each etching operation (e.g., operation 215) may be characterized by an amount of the silicon-and-oxygen-containing material removed, which may be about 10 Å or more, about 20 Å or more, about 30 Å or more, about 10 Å to about 100 Å, about 10 Å to about 50 Å, about 25 Å to about 75 Å, or about 50 Å to about 100 Å. The amount of the silicon-and-oxygen-containing material removed is measured at the top of the feature.

During each operation of the method 200, the semiconductor processing chamber may be maintained at a variety of pressures. For example, a pressure within the semiconductor processing chamber may be maintained at greater than or about 1 Torr, at greater than or about 2 Torr, greater than or about 3 Torr, greater than or about 4 Torr, greater than or about 5 Torr, between about 1 Torr and about 100 Torr, between about 1 Torr and about 10 Torr, or between about 1 Torr and about 5 Torr.

During each operation of the method 200, the semiconductor processing chamber may be maintained at a variety of temperatures. For example, a temperature within the semiconductor processing chamber may be maintained at greater than or about 450° C., greater than or about 500° C., greater than or about 550° C., greater than or about 600° C., or more. The temperature may be maintained at less than or about 650° C., less than or about 600° C., less than or about 550° C., less than or about 500° C., or less.

Figure 4:
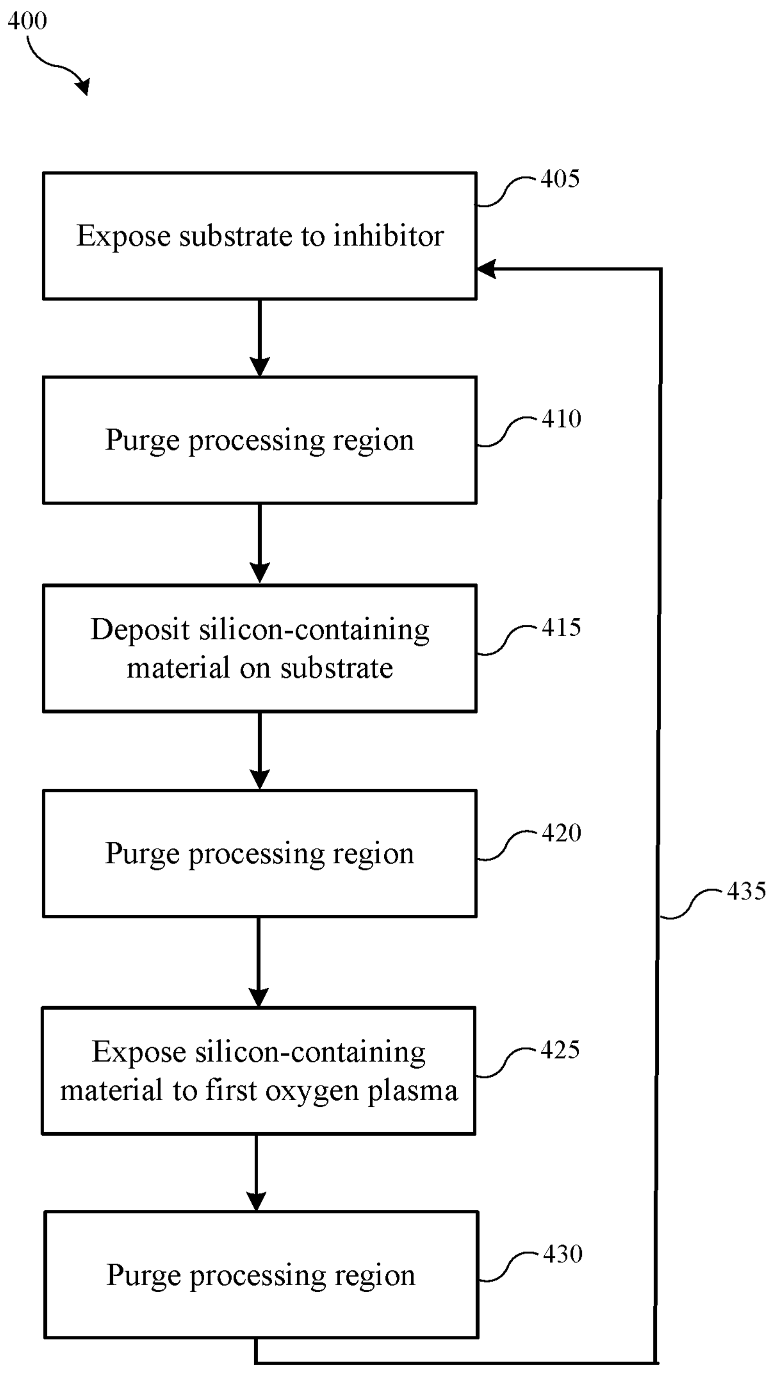
FIG. 4 shows operations in a semiconductor processing method according to some embodiments of the present technology.

FIG. 4 shows exemplary operations in a processing method 400 according to some embodiments of the present technology. The method 400 may be performed in a variety of processing chambers, including the semiconductor processing chamber 100 described above. Method 400 may include one or more operations prior to the initiation of the method 400, including front-end processing, deposition, etching, polishing, cleaning, or any other operations that may be performed prior to the described operations. The methods 400 may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 400 may describe operations shown schematically in FIGS. 5A-5H, the illustrations of which will be described in conjunction with the operations of method 400. It is to be understood that the figures illustrate only partial schematic views, and a substrate may contain any number of additional materials and features having a variety of characteristics and aspects as illustrated in the figures.

Figure 5A:
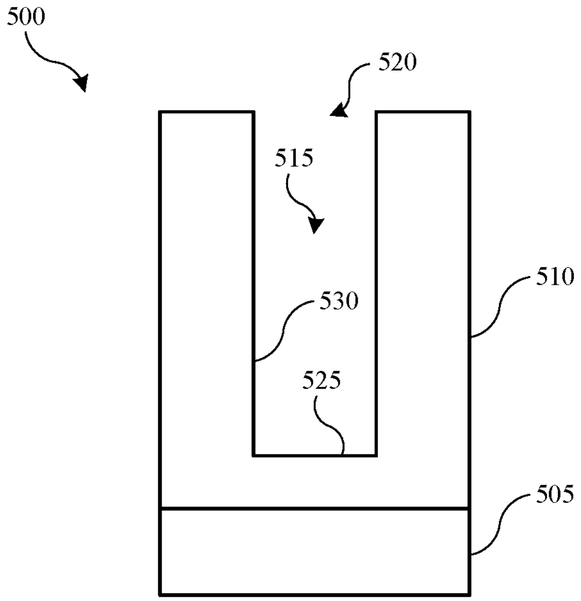
FIGS. 5A-5H show exemplary schematic cross-sectional structures in which material layers are included and produced according to some embodiments of the present technology.
Figure 5B:
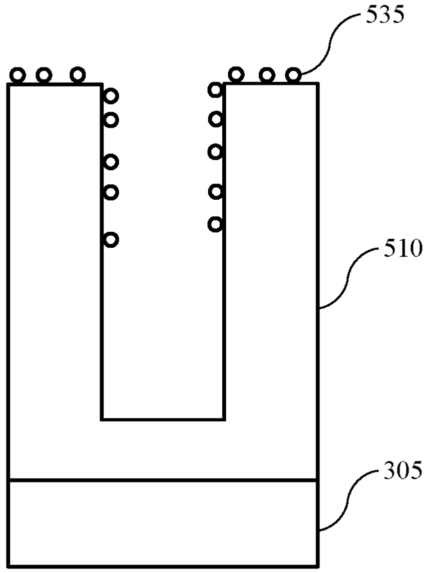
Figure 5C:
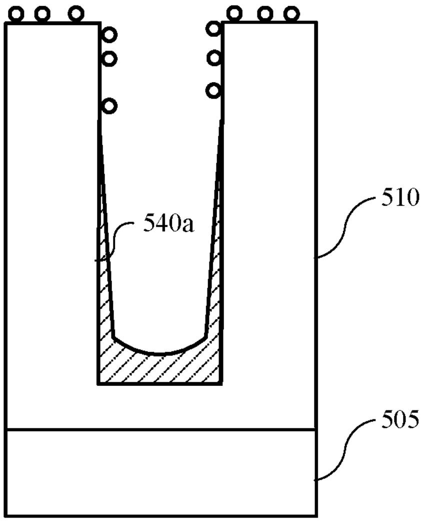
Figure 5D:
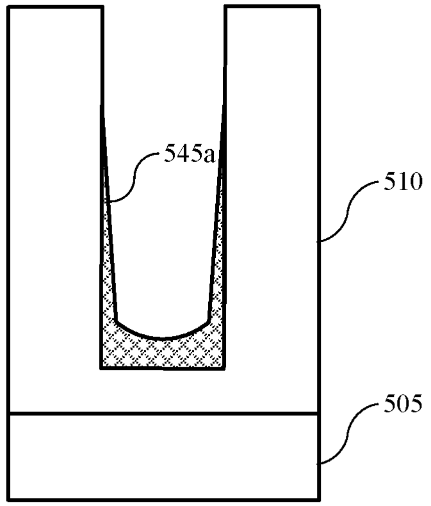

Method 400 may or may not involve optional operations to develop the semiconductor structure to a particular fabrication operation. It is to be understood that method 400 may be performed on any number of semiconductor structures or substrates 505, as illustrated in FIG. 5A, including exemplary structure 500 on which one or more silicon-containing materials may be formed. As illustrated in FIG. 5A substrate 505 may be processed to form one or more features 515, which may be recessed, such as trenches, apertures, or any other structure in semiconductor processing. Substrate 505 may be any number of materials, such as a base wafer or substrate 505 made of silicon or silicon-containing materials, other substrate 505 materials, as well as one or more materials that may be formed overlying the substrate 505 during semiconductor processing. For example, in some embodiments the substrate 505 may be processed to include one or more materials or structures for semiconductor processing. Substrate 505 may be or may include a dielectric material, such as an oxide or nitride of any number of materials. In embodiments, one or more layers of material 510 may be deposited on the substrate 505. In embodiments, the one or more layers of material 510 may be or may include a silicon-containing material. The silicon-containing material may be or may include silicon, including amorphous silicon, doped silicon, silicon oxide, silicon nitride, or silicon carbide.

As shown, one or more features 515 may be defined by the one or more layers of material 510 and/or substrate 505, such as a trench, aperture, or other recessed feature. The features 515 has a top 520, a bottom 525, and sidewalls 530 connecting the top 520 and bottom 525.

While the illustrated features 515 are characterized by vertical sidewalls, the features may alternatively be characterized by tapered sidewalls. In tapered sidewall embodiments, the features may be characterized by a larger diameter or width at the top of the features than at the bottom of the features. The aspect ratio of the features, or the ratio of the depth of the feature relative to the width or diameter of the feature formed, may be greater than or about 1:1, and may be greater than or about 2:1, than or about 3:1, greater than or about 4:1, greater than or about 5:1, greater than or about 6:1, greater than or about 7:1, greater than or about 8:1, greater than or about 9:1, greater than or about 10:1, or more.

Although only one feature 515 is shown in the figures, it is to be understood that exemplary structures may have any number of features 515 defined along the structure according to embodiments of the present technology.

The method 400 includes operation 405 that exposes the substate 505 to a nitrogen-containing inhibitor 535. The nitrogen-containing inhibitor 535 preferentially absorb on or near the top 520 of the features 515 as compared to the bottom 525 of the features 515, illustrated in FIG. 5B. Then, in operation 410, the processing region is purged to remove excess nitrogen-containing inhibitor 535. After operation 410, the method 400 includes operation 415 that deposits a silicon-containing material 540*a* on the substrate. The disclosure relating to operation 225 of FIG. 2 applies to the operation 410 of FIG. 4.

The nitrogen-containing inhibitor 535 reduces or inhibits deposition of the silicon-containing material 540*a*. Therefore, because the nitrogen-containing inhibitor 535 is on the surface near the top 520 of the feature 515, the silicon-containing material 540*a* preferentially deposits on or near the bottom 525 of the features 515 as compared to the top 520 of the features 515, illustrated in FIG. 5C.

After operation 415, operation 420 may be performed where the processing region is purged to remove excess silicon-containing precursor. The disclosure relating to operation 230 of FIG. 2 applies to the operation 420 of FIG. 4. After operation 420, the method 200 includes operation 425 that exposes the silicon-containing material to an oxygen plasma to convert the silicon-containing material 540*a* to a silicon-and-oxygen-containing material 545*a*, illustrated in FIG. 5D. While FIG. 5D does not illustrate nitrogen-containing inhibitor 535 being present, the nitrogen-containing inhibitor 535 may still be present. The disclosure relating to operation 235 of FIG. 2 applies to the operation 425 of FIG. 4.

Then, after operation 425, the method includes operation 430 where the processing region is purged to remove remnants from the oxygen plasma and byproducts from the conversion of the silicon-containing material 540*a* to the silicon-and-oxygen-containing material 545*a*. The disclosure relating to operation 240 of FIG. 2 applies to the operation 430 of FIG. 4.

Figure 5E:
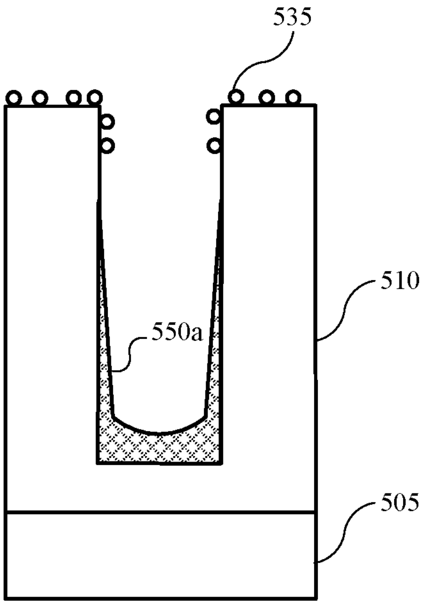
Figure 5F:
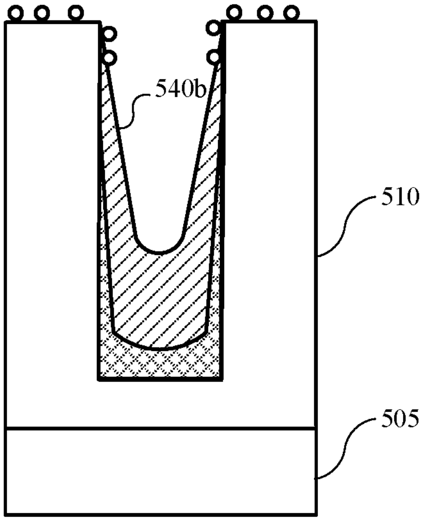
Figure 5G:
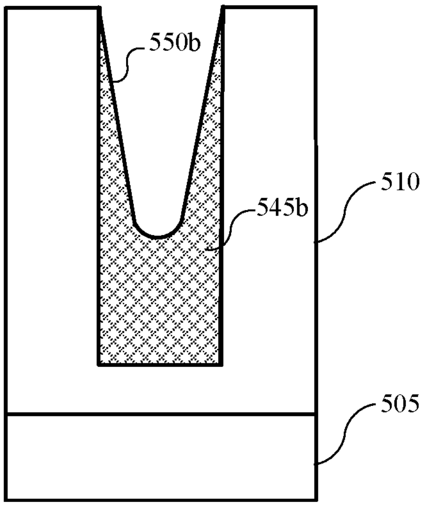
Figure 5H:
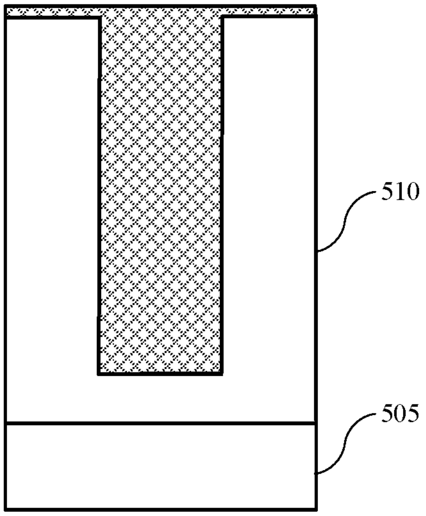

The method includes iteratively repeating 435 operations 405, 410, 415, 420, 425, and 430 z number of times until the feature 315 is filled with the silicon-and-oxygen-containing material. FIG. 5E illustrates a second iteration of operation 405 where the nitrogen-containing inhibitor 535 is preferentially absorbs on and near the top 520 of the features 515. FIG. 5F illustrates a second iteration of operation 415 that deposits the silicon-containing material 540*b* preferentially on and near the bottom 325 of the features 315. FIG. 5G illustrates conversion of the silicon-containing material 540*b* to a silicon-and-oxygen-containing material 545*b*. FIG. 5H illustrates the features 515 being filled with the silicon-and-oxygen-containing material 545*c* after iteratively repeating the operations 405, 410, 415, 420, 425, and 430.

As illustrated in FIGS. 3A-3H, the silicon-and-oxygen-containing material builds up over the iterative cycling 435 of the method and forms tapered sidewalls 550*a* and 550*b* because of the nonconformal deposition of the silicon-containing material. Advantageously, the method 400 illustrated in FIG. 4 and FIGS. 5A-5H increase the degree of tapering of the sidewalls of the silicon-and-oxygen-containing material fills the features 515. As such, the opening the top 520 of the features 515 may be sufficiently large for each method 400 to mitigate formation of a void or seam.

Referring back to operation 405, the nitrogen-containing inhibitor 535 may be a product of a plasma produced using a nitrogen-containing precursor. Examples of nitrogen-containing precursors may include, but are not limited to, ammonia ($NH_3$), nitrogen ($N_2$), or a combination thereof. The nitrogen-containing precursor may be present at about 5 mol % or greater, about 10 mol % or greater, about 25 mol % or greater, about 50 mol % or greater, about 75 mol % or greater, about 5 mol % to about 90 mol %, about 5 mol % to about 75 mol %, about 5 mol % to about 50 mol %, or about 10 mol % to about 75 mol %, based on a total number of mols of gas used to produce the plasma. The balance of the gas may be inert gases like $N_2$ and/or Ar. Without being limited by theory, it is believed that lower concentrations of nitrogen-containing precursor increases preferential absorption of the nitrogen-containing inhibitor 535 at and near the top 520 of the features 515 because less of the nitrogen-containing inhibitor 535 is present and, therefore, absorbs before reaching the bottom 525 of the features 515. While dilution with an inert gas may not be necessary for top inhibition, dilution may preferably result in depth-selective inhibition.

Further, as with operation 215 of FIG. 2, nonconformal absorption of the nitrogen-containing inhibitor 535 may be achieved by controlling the spacing between the substrate and the inhibitor entrance to the processing region (where a lower distances may increase absorption at the bottom of the features), controlling the plasma power (where a higher plasma power may increase absorption at the bottom of the features), controlling the duration of the absorption, controlling the pressure during absorption, controlling a pressure in the processing region, controlling a concentration of the nitrogen-containing inhibitor in the processing region, selecting plasma sources and/or conditions (e.g., radiofrequency (RF) plasma or remote plasma source (RPS), pulsing, etc.), and any combination thereof.

The distance between the substrate and the inhibitor entrance to the processing region may be controlled by adjusting the distance between the substrate support 104 and the gas distributor 112 of the semiconductor processing chamber 100. One skilled in the art will recognize the application and adjustment of this distance to other semiconductor processing chambers having different configurations.

Without being limited by theory, it is believed that closer distances increase the conformality of the absorption of the nitrogen-containing inhibitor 535. However, distances too far apart may not provide sufficient absorption of the nitrogen-containing inhibitor 535, even at the top of the features. The distance between the substrate and the inhibitor entrance to the processing region may be about 150 mil or greater, about 200 mil or greater, about 250 mil or greater, about 300 mil or greater, about 150 mil to about 2000 mil, about 150 mil to about 1500 mil, about 300 mil to about 1500 mil, about 300 mm to about 1200 mm, or about 500 mil to about 2000 mil.

Without being limited by theory, higher plasma powers may increase the conformality of the absorption of the nitrogen-containing inhibitor 535 and increase faceting. The plasma power in operation 215 may be about 1000 W or less, about 750 W or less, about 500 W or less, about 400 W or less, about 300 W or less, about 200 W or less, about 100 W or less, about 1 W to about 1000 W, about 1 W to about 750 W, about 1 W to about 500 W, about 1 W to about 250 W, about 1 W to about 100 W, about 50 W to about 250 W, about 50 W to about 300 W, about 100 W to about 300 W, about 250 W to about 500 W, about 250 W to about 1000 W, or about 500 W to about 1000 W. Depth selective inhibition may preferably be at power levels of about 500 W or less.

Without being limited by theory, higher exposure times may increase the conformality of the absorption of the nitrogen-containing inhibitor 535. The exposure time (or length of time of operation 215 is performed) to the nitrogen-containing inhibitor 535 may be about 60 seconds or less, about 45 seconds or less, about 30 second or less, about 15 seconds or less, about 5 seconds or less, about 1 second or less, about 0.1 seconds to about 60 seconds, about 1 second to about 30 seconds, or about 5 seconds to about 30 second.

Without being limited by theory, higher pressure in the semiconductor processing chamber during absorption of the nitrogen-containing inhibitor 535 may increase the conformality of the absorption. However, with a plasma-based method, non-conformality may still be observed even at high pressure. The pressure within the semiconductor processing chamber during absorption of the nitrogen-containing inhibitor 535 may be maintained at greater than or about 1 Torr, at greater than or about 2 Torr, greater than or about 3 Torr, greater than or about 4 Torr, greater than or about 5 Torr, between about 1 Torr and about 30 Torr, between about 1 Torr and about 10 Torr, between about 1 Torr and about 5 Torr, or between about 5 Torr and about 20 Torr.

As nonconformal absorption of the nitrogen-containing inhibitor 535 is desired, the concentration of the nitrogen-containing precursor used to make the plasma, the distance between the substrate and the inhibitor entrance, the plasma power, the exposure time, and the pressure may be selected to provide selective absorption of the nitrogen-containing inhibitor 535 on or near the top 520 of the features 515 as compared to the bottom 525 of the features 515. As the silicon-and-oxygen-containing material 545 builds up, the degree of tapering of the sidewalls 550 of the silicon-and-oxygen-containing material 545 may increase.

During each operation of the method 400, the semiconductor processing chamber may be maintained at a variety of pressures. For example, a pressure within the semiconductor processing chamber may be maintained at greater than or about 1 Torr, at greater than or about 2 Torr, greater than or about 3 Torr, greater than or about 4 Torr, greater than or about 5 Torr, between about 1 Torr and about 100 Torr, between about 1 Torr and about 10 Torr, between about 1 Torr and about 5 Torr, between about 5 Torr and about 50 Torr, or between about 25 Torr and about 100 Torr.

During each operation of the method 400, the semiconductor processing chamber may be maintained at a variety of temperatures. For example, a temperature within the semiconductor processing chamber may be maintained at greater than or about 450° C., greater than or about 500° C., greater than or about 550° C., greater than or about 600° C., or more. The temperature may be maintained at less than or about 650° C., less than or about 600° C., less than or about 550° C., less than or about 500° C., or less.

Methods of the present disclosure also include a hybrid of method 200 and method 400 where method 400 is substituted for the deposition cycle 205 of the method 200. That is, operations 405, 410, 415, 420, 425, and 430 may be iteratively repeated. After iteratively repeating said operations in method 400 x number of times, the hybrid method may include operation 215 by exposing the silicon-and-oxygen-containing material to an etching agent. Then, the operations in method 400 may again be iteratively repeated followed by operation 215, where the iterative repetition of method 400 followed by operation 215 may occur y number of times.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a silicon-containing precursor" includes a plurality of such precursors, and reference to "the silicon-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

i) providing a nitrogen-containing inhibitor to a processing region of a semiconductor processing chamber, wherein a gas used to produce the nitrogen-containing inhibitor comprises about 12 mol % to about 75 mol % of a nitrogen-containing precursor, wherein a substrate is disposed within the processing region of the semiconductor processing chamber, wherein the substrate defines one or more features along the substrate, and wherein each of the one or more features has a top, a bottom, and sidewalls connecting the top and the bottom;

ii) absorbing the nitrogen-containing inhibitor on the top of the one or more features to a greater extent than on the bottom of the one or more features;

iii) depositing a silicon-containing material on the substrate after operation ii;

iv) exposing the silicon-containing material to an oxygen plasma to convert the silicon-containing material to a silicon-and-oxygen-containing material; and v) repeating operations i through iv to iteratively to fill the one or more features with the silicon-and-oxygen-containing material.

2. The semiconductor processing method of claim 1, wherein a distance between the substrate and where the nitrogen-containing inhibitor enters the processing region is about 4 mm to about 50 mm.

3. The semiconductor processing method of claim 1, wherein the nitrogen-containing inhibitor is a product of a plasma of a nitrogen-containing precursor and the plasma is formed at a plasma power of about 500 W or less.

4. The semiconductor processing method of claim 1, wherein the nitrogen-containing inhibitor is a product of a plasma of a nitrogen-containing precursor and an exposure time to the plasma is about 60 seconds or less.

5. A semiconductor processing method comprising:

i) providing a nitrogen-containing inhibitor to a processing region of a semiconductor processing chamber, wherein a substrate is disposed within the processing region of the semiconductor processing chamber, wherein the substrate defines one or more features along the substrate, and wherein each of the one or more features has a top, a bottom, and sidewalls connecting the top and the bottom, and wherein a gas used to produce the nitrogen-containing inhibitor comprises about 12 mol % to about 75 mol % of a nitrogen-containing precursor;

ii) absorbing the nitrogen-containing inhibitor on the top of the one or more features to a greater extent than on the bottom of the one or more features;

iii) depositing a silicon-containing material on the substrate after operation ii;

iv) exposing the silicon-containing material to an oxygen plasma to convert the silicon-containing material to a silicon-and-oxygen-containing material; and v) repeating operations I through iv iteratively to deposit about 50 Å to about 500 Å of the silicon-and-oxygen-containing material on the one or more features on the substrate;

vi) exposing the silicon-and-oxygen-containing material to an etching agent to remove about 10 Å to about 100 Å of the silicon-and-oxygen-containing material; and vii) repeating operations v through vi iteratively ending with the operation v to fill the one or more features with the silicon-and-oxygen-containing material.

6. The semiconductor processing method of claim 5, wherein the etching agent comprises products of a plasma produced using a halogen-containing precursor.

7. The semiconductor processing method of claim 6, wherein the halogen-containing precursor comprises one or more of: nitrogen trifluoride ($NF_3$), hydrogen bromide (HBr), fluoromethane ($CH_3F$), difluoromethane ($CH_2F_2$), trifluoromethane ($CHF_3$), carbon tetrafluoride ($CF_4$), and boron trichloride ($BCl_3$).

8. The semiconductor processing method of claim 6, wherein the plasma is formed at a plasma power of about 500 W or less.

9. The semiconductor processing method of claim 6, wherein the gas used to produce the nitrogen-containing inhibitor comprises about 25 mol % to about 75 mol % of a nitrogen containing precursor.

10. The semiconductor processing method of claim 5, wherein the nitrogen-containing inhibitor is a product of a plasma of a nitrogen-containing precursor.

11. The semiconductor processing method of claim 10, wherein the nitrogen-containing precursor comprises ammonia, nitrogen, or a combination thereof.

12. The semiconductor processing method of claim 10, wherein the plasma is formed at a plasma power of about 500 W or less.

13. The semiconductor processing method of claim 10, wherein an exposure time to the plasma is about 60 seconds or less.

14. The semiconductor processing method of claim 5, wherein a distance between the substrate and where the nitrogen-containing inhibitor enters the processing region is about 4 mm to about 50 mm.

15. The semiconductor processing method of claim 5, wherein after each operation vi after a first operation of vi, an angle of a sidewall of the silicon-and-oxygen-containing material increases from a previous operation vi.

16. The semiconductor processing method of claim 15, wherein the angle increases by about 5° or greater from the previous operation vi.

17. The semiconductor processing method of claim 5, wherein exposing the silicon-and-oxygen-containing material to the etching agent nonconformally removes a portion of the silicon-and-oxygen-containing material.

* * * * *